United States Patent
Mok et al.

(10) Patent No.: US 7,284,894 B2
(45) Date of Patent: Oct. 23, 2007

(54) LIGHT SOURCE UTILIZING A FLEXIBLE CIRCUIT CARRIER

(75) Inventors: Thye Linn Mok, Taman Sri Rambai (MY); Sundar Yoganandan, Jalan Helang (MY); Ju Chin Poh, Taman Muhibbah (MY); Siew It Pang, Persianan Kelicap (MY)

(73) Assignee: Avago Technologies ECELIIP (Singapore) Pte Ltd, Singapore (SG)

( * ) Notice: Subject to any disclaimer, the term of this patent is extended or adjusted under 35 U.S.C. 154(b) by 135 days.

(21) Appl. No.: 11/140,865

(22) Filed: May 31, 2005

(65) Prior Publication Data
US 2006/0268551 A1    Nov. 30, 2006

(51) Int. Cl.
*F21V 7/04*    (2006.01)
(52) U.S. Cl. .................. 362/631; 362/612; 362/615
(58) Field of Classification Search ........... 362/612, 362/615, 630–631; 361/749
See application file for complete search history.

(56) References Cited

U.S. PATENT DOCUMENTS

| | | | |
|---|---|---|---|
| 5,890,794 A | * | 4/1999 | Abtahi et al. ............... 362/294 |
| 5,976,686 A | * | 11/1999 | Kaytor et al. ............. 428/317.9 |
| 6,806,920 B2 | * | 10/2004 | Hayashi et al. ................ 349/58 |
| 2002/0008805 A1 | * | 1/2002 | Kawakami et al. ........... 349/61 |
| 2003/0223218 A1 | * | 12/2003 | Kawakami ................... 362/31 |

FOREIGN PATENT DOCUMENTS

JP    2002-40423 A    *    2/2002

* cited by examiner

*Primary Examiner*—Sandra O'Shea
*Assistant Examiner*—Jason Moon Han

(57) ABSTRACT

A light source having light emitting modules coupled to a flexible circuit carrier. The flexible circuit carrier includes a sheet of flexible material having electrically conducting traces connecting a circuit mounting area and a connector region. The light emitting modules are electrically connected to the circuit mounting area. In one embodiment, the light emitting modules are arranged in a linear array. The light source preferably includes a light pipe having a planar layer of transparent material, the light emitting modules being bonded to an edge of the planar layer. The light pipe is preferably attached to a printed circuit board and the connection region of the flexible circuit carrier is attached to the printed circuit board. The flexible circuit carrier can move heat from the light emitting modules to the printed circuit board as well as providing electrical connections.

14 Claims, 5 Drawing Sheets

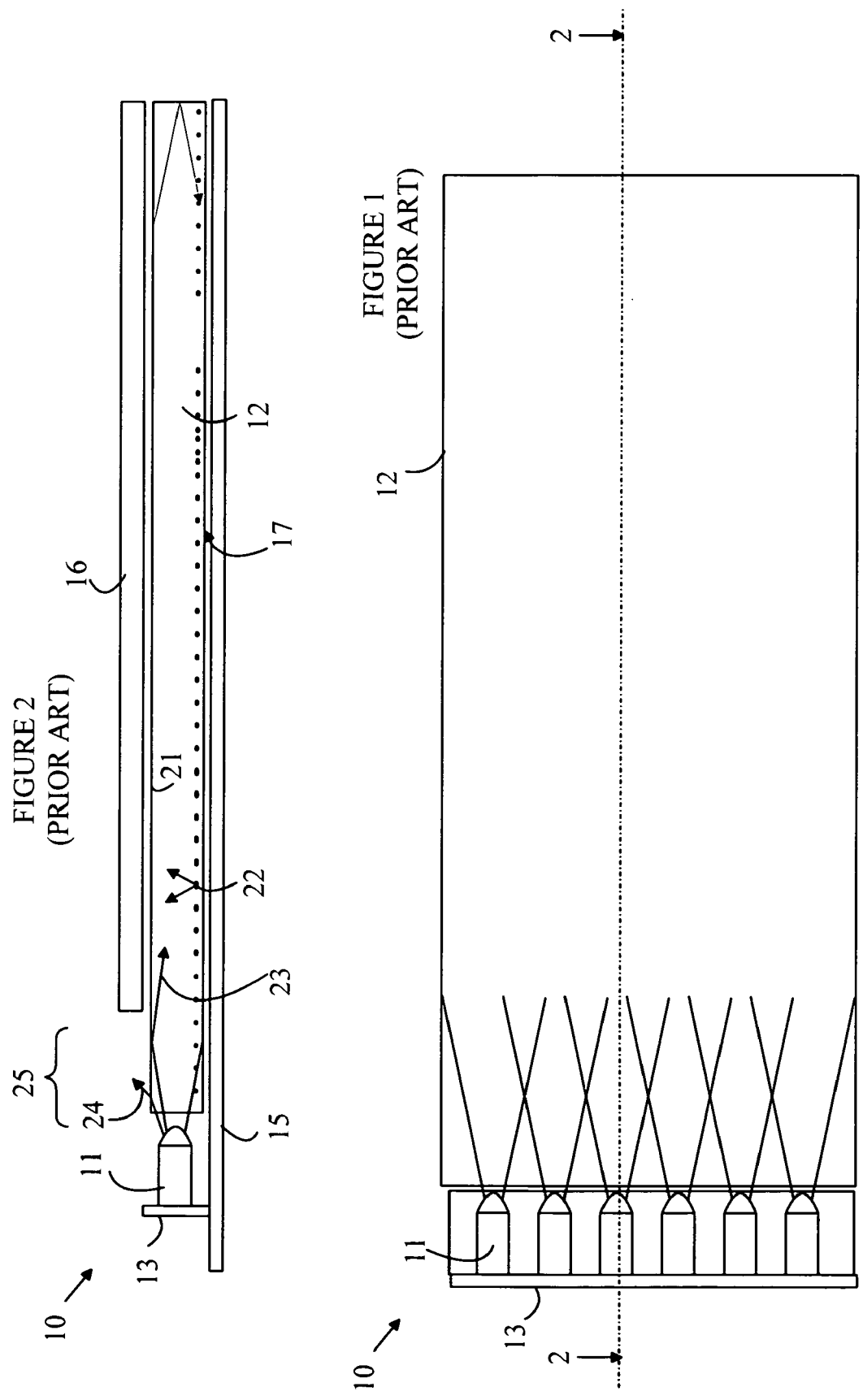

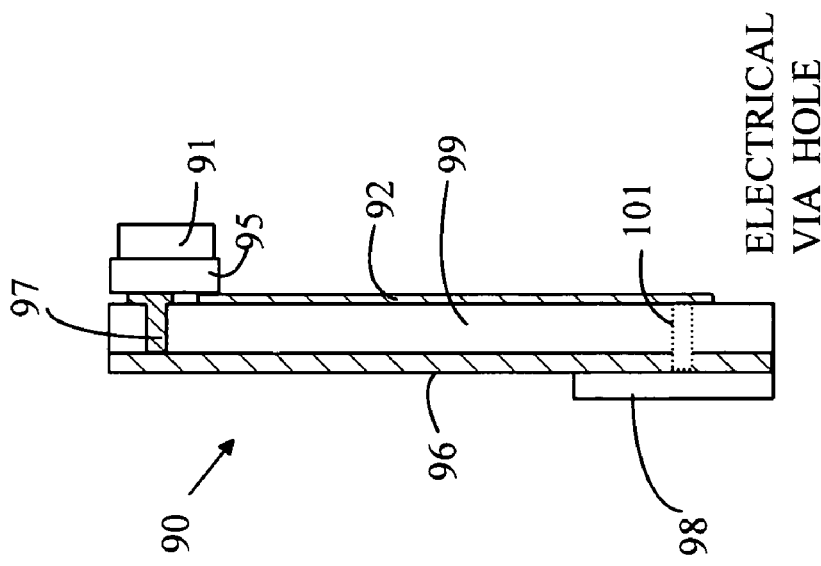
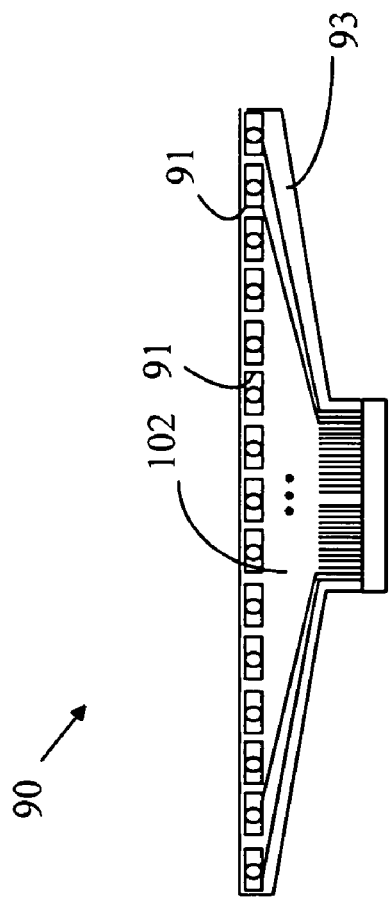
FIGURE 8
FIGURE 7

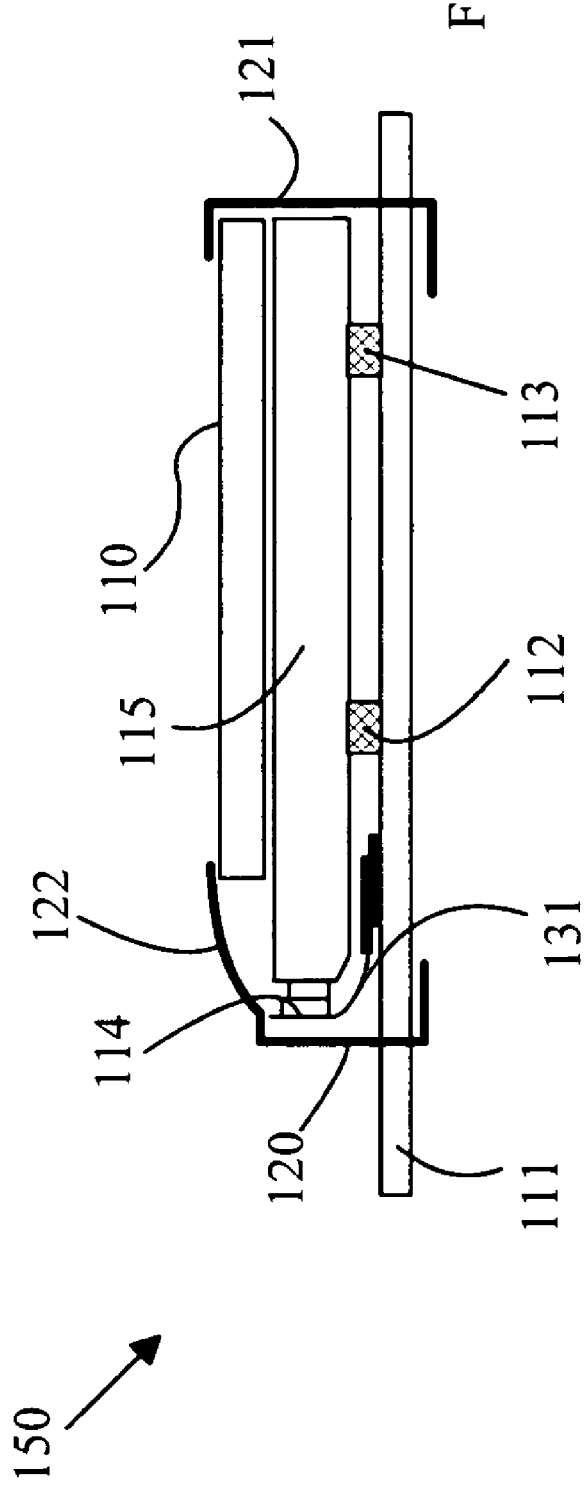

US 7,284,894 B2

LIGHT SOURCE UTILIZING A FLEXIBLE CIRCUIT CARRIER

BACKGROUND OF THE INVENTION

Liquid crystal displays (LCDs) are used in a wide variety of computers and consumer devices such as TVs. A backlighted LCD is an array of pixels in which each pixel acts as a shutter that either passes or blocks light from a light source that is located behind the pixel. Color displays are implemented by equipping the pixels with color filters such that each pixel transmits or blocks light of a particular color. The intensity of the light from each pixel is set by the time the pixel is in the transmissive state.

The display is typically illuminated by a white light source that provides a uniform intensity of light across the back surface of the display. Illumination sources based on fluorescent lights are particularly attractive because of their high light output per watt-hour of power consumed. However, such sources require high driving voltages which makes them less attractive for battery operated devices.

As a result, there has been considerable interest in utilizing light sources based on LEDs in such applications. LEDs have similar electrical efficiency and long lifetimes. In addition, the driving voltages needed are compatible with the battery power available on most portable devices. An LED light source for generating an arbitrary color of light is typically constructed from three LEDs. The relative intensities of the LEDs are adjusted by adjusting the drive current through the LEDs and/or the duty factors of the LEDs. In the latter arrangement, the LEDs are turned on and off within a cycle time that is too short to be perceived by a human observer. The intensity of the light seen by the viewer is the average intensity, and hence, the relative intensities of the various colors is determined by the percentage of the time the various LEDs are turned on.

Back lighted illumination systems for LCD arrays typically utilize some form of light box or light pipe behind the LCD array. The light pipe is a rectilinear transparent solid constructed from a transparent plastic having one surface that has dimensions that are larger than the LCD array. The goal of the illumination system is to have this surface act as an extended light source having a uniform light intensity over the surface. Light is injected into the light pipe at the periphery of the light pipe. The light is trapped in the light pipe by internal reflections until the light is scattered in a manner that allows it to escape through the top surface, which is the surface that is adjacent to the LCD array. The bottom surface of the light box or the material of the light pipe itself has scattering centers that redirect the light hitting each center so that a portion of the light exits through the top surface.

The thickness of the light source is limited by the thickness of the light box. The thickness of the display is particularly important in displays used for laptop computers and handheld devices such as PDAs and cellular telephones, as the display thickness limits the overall thickness of the device. Some of these portable devices require light boxes that are less than 1 mm in thickness.

As the thickness of the display decreases, the efficient injection of light into the light pipe becomes more problematic. Light must enter the edge of the light pipe at a predetermined point within a predetermined cone of angles. Typically, the light source consists of a number of packaged LEDs that are mounted on a small substrate such that the light emission direction of the LEDs is parallel to the surface of the light pipe. This substrate is attached to a circuit board that is under the light pipe such that light is emitted into the edge of the light pipe. If the relative positions of the light source and light pipe are not correct, part of the light can be lost either because the light misses the edge of the light pipe or because the angle at which some of the light enters the light pipe is greater than the critical angle, and hence, that light leaves the light pipe at the first reflection. In either case, the efficiency and/or the uniformity of the illumination system is reduced.

SUMMARY OF THE INVENTION

The present invention includes a light source having light emitting modules coupled to a flexible circuit carrier. The flexible circuit carrier includes a sheet of flexible material having electrically conducting traces connecting a circuit mounting area and a connector region. The light emitting modules are electrically connected to the circuit mounting area. In one embodiment, the light emitting modules are arranged in a linear array. In one embodiment, the light emitting modules include a plurality of LED dies bonded to a substrate, the LED dies are encapsulated in a layer of clear encapsulant. In one embodiment, the light source includes a light pipe having a planar layer of transparent material characterized by a light pipe thickness and top and bottom surfaces. The light emitting modules are bonded to an edge of the planar layer such that light from the light emitting modules enters the edge and is reflected between the top and bottom surfaces. The bottom surface includes light scattering centers for scattering light in the planar layer at angles that allow the light to exit the top surface. In one embodiment, the light pipe is attached to a printed circuit board and the connection region of the flexible carrier is attached to the printed circuit board. In one embodiment, the planar layer is divided into an illumination region and a light mixing region, and the light source further includes a reflector for directing light leaving the top surface in the mixing region back through the top surface of the mixing region. In one embodiment, the light source includes an LCD panel that is illuminated by light leaving the top surface, the LCD panel being positioned over the illumination region.

BRIEF DESCRIPTION OF THE DRAWINGS

FIG. 1 is a top view of light source 10.
FIG. 2 is a cross-sectional view of light source 10 through line 2-2 shown in FIG. 1.
FIG. 7 is a top view of light source 90.
FIG. 8 is a side view of light source 90.
FIG. 9 is a cross-sectional view of a display 150 according to one embodiment of the present invention.

DETAILED DESCRIPTION OF THE PREFERRED EMBODIMENTS OF THE INVENTION

Figure 3:
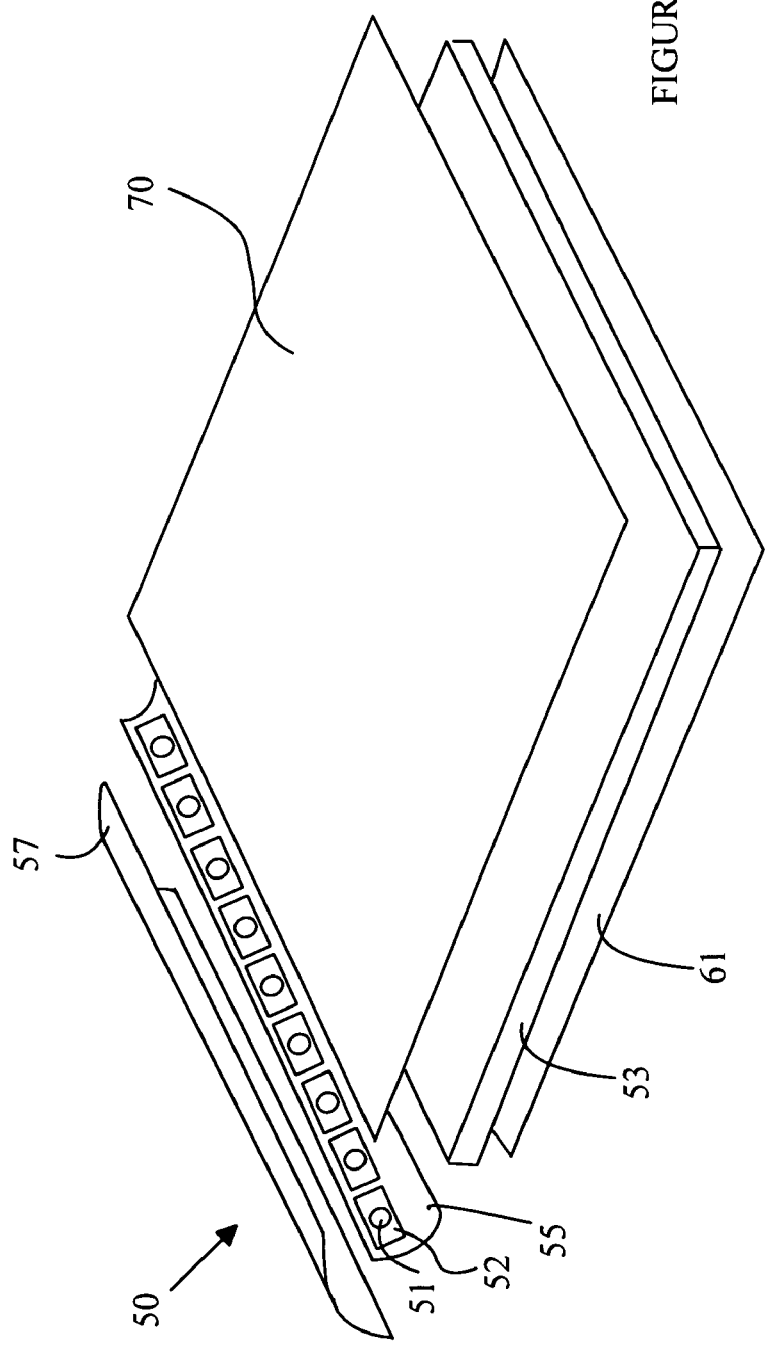
FIG. 3 is an exploded perspective view of light source 50.

The manner in which the present invention provides its advantages can be more easily understood with reference to FIGS. 1 and 2, which illustrate a prior art light box arrangement for illuminating an LCD display 16. FIG. 1 is a top view of light source 10, and FIG. 2 is a cross-sectional view of light source 10 through line 2-2 shown in FIG. 1. Light source 10 utilizes an array of LEDs 11 to illuminate a light pipe 12. The LEDs are mounted on a circuit board 13 that is mounted on a second board 15 that provides power to the LEDs. The LEDs are positioned such that light leaving the top of each LED illuminates the end of light pipe 12. The light 23 entering light pipe 12, at an angle with respect to the surface 21 that is less than the critical angle, is reflected back and forth within light pipe 12 until the light is either absorbed or scattered by particles 22 on surface 17. The scattered light that strikes surface 21 at angles greater than the critical angle escapes from the light pipe and illuminates the back surface of LCD display 16. The bottom surface of the light pipe is covered with a reflective material; hence, any light striking the bottom surface is reflected upward.

In the region of the light pipe near the LEDs, some of the rays will enter the light pipe at angles greater than the critical angle and immediately escape through the top surface of the light pipe as shown at 24. It should be noted that rays striking the bottom surface at angles greater than the critical angle will be reflected upwards at angles greater than the critical angle with respect to surface 21 and will also be lost. As a result, region 25 of the light pipe is not used to illuminate the LCD display. This region acts as a mixing region for mixing the light from the various LEDs.

It should be noted that the amount of light that is lost through region 25 will, in general, depend on the vertical positioning of the LEDs. If the LEDs are too low, then more light will leave region 25, since a greater fraction of the light leaving the LEDs will strike surface 21 at angles greater than the critical angle. In addition, the size of region 25 is also dependent on the vertical positioning of the LEDs to some extent. While vertical positioning errors can be accommodated by increasing the size of region 25, such increases increase the size of the display and the power needed to provide a given level of illumination to the LCD display.

The size of mixing region 25 also depends on the separation between the individual LEDs. The LEDs typically include LEDs that emit light in three wavelength bands, namely, red, blue, and green. The relative intensities of the light emitted in the bands determine the color of the light source as perceived by a human observer. Since each LED is typically limited to emitting light in only one band, the LEDs are normally arranged in an order in which each LED emits light in a different band from that of its neighbors. Mixing region 25 must be long enough to assure that light from a number of neighboring LEDs is mixed when the light leaves mixing region 25 to assure that there are no color variations in the regions beyond the mixing region. Accordingly, designs in which three LEDs that emit light in different bands are placed as close to one another as possible are preferred, since such an arrangement provides the better mixing of the colors in any given mixing region. In prior art systems of the type shown in FIGS. 1 and 2, the minimum spacing for the LEDs is limited by the packaging of the LEDs, and hence, larger mixing regions are needed.

Heat dissipation is also a significant problem for displays of the type discussed above. The heat generated by the LEDs is considerable, and hence, must be dissipated to the surrounding air by a surface that is greater than the area of substrate 13 on which the LEDs are mounted. Printed circuit board 15 can be utilized to dissipate the heat provided there is sufficient contact area between substrate 13 and printed circuit board 15. To provide adequate heat conduction, substrate 13 is typically soldered to printed circuit board 15. The solder connections also provide the signal lines for the electrical signals used to drive the LEDs. This ridged coupling causes two problems. First, the accuracy of the alignment of the LEDs relative to light pipe 12 depends on the precision of this bond. Second, the heat transferred to printed circuit board 15 causes the printed circuit board to heat up during the operation of the LCD display. This change in temperature can result in the board flexing such that the alignment of the LEDs relative to the printed circuit board is altered.

The present invention utilizes a flexible circuit carrier to make the connection between the array of LEDs and the ridged circuit board 15 discussed above. The flexible printed circuit board provides the tolerance needed to accommodate the flexiture of printed circuit board 15 due to temperature changes and allows the LEDs to be connected to printed circuit board 15 in a manner that does not rely on a precision mounting. Since flexible printed circuit boards are known to the art, such devices will not be discussed in detail here. For the purposes of the present discussion it is sufficient to note that flexible circuit carriers can be fabricated by depositing a thin metal layer on a flexible resin substrate and then converting the layer into a plurality of individual conductors by conventional photolithographic techniques.

Figure 4:
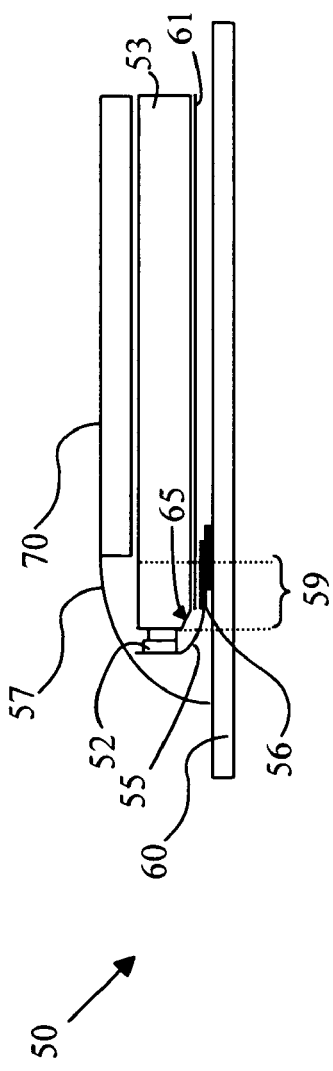
FIG. 4 is a cross-sectional view of light source 50.

Refer now to FIGS. 3 and 4, which illustrate a light source 50 according to one embodiment of the present invention for illuminating a display panel 70. FIG. 3 is an exploded perspective view of light source 50, and FIG. 4 is a cross-sectional view of light source 50. Light source 50 includes a plurality of LEDs 51 that are mounted on a substrate 52. The LEDs are bonded to the edge of a light pipe 53 by an optically transparent medium. The substrate 52 includes the leads needed to power each of the LEDs. The leads are solder bonded to conductive lines that are part of flexible circuit substrate 55. The conductive traces terminate in a connector 56 that is bonded to printed circuit board 60, which includes a corresponding set of conductors for driving the LEDs. The arrangement of the conductive traces will be discussed in more detail below.

Light source 50 also includes a reflector 57. The reflector serves two functions. First, the reflector prevents light that is being reflected back and forth in the light guide from escaping and generating unwanted background illumination. Second, reflector 57 recycles some of the light that leaves through the top surface of light pipe 53 in the color mixing region 59.

Light source 50 also includes a reflective sheet 61 under light pipe 53 that prevents light from escaping through the bottom surface. Light pipe 53 includes scattering centers that function in a manner analogous to that discussed above with reference to FIG. 2 that scatter a portion of the light traveling in the light pipe such that the scattered light can escape the light pipe through the top surface of the light pipe. The scattering centers can be suspended in the plastic of the light pipe or be distributed on the bottom surface of the light pipe as discussed above with respect to FIGS. 1 and 2. Some of the scattered light will be directed in the downward direction. Reflective sheet 61 redirects that light toward the upper surface of light pipe 53.

In one embodiment, light guide 53 includes a tapered edge 65 to prevent flexible circuit carrier 55 from being damaged by contact with the edge of light pipe 53.

The preferred light source for illuminating the edge of the light pipe is a white line source. LEDs, on the other hand, are inherently point sources that emit light in a narrow band of wavelengths, and hence, are not "white". Hence, a number of LEDs must be combined to provide an approximation to a white line source. White LEDs can be constructed by combining light from a number of color LEDs. Typically, three LEDs that emit light in the red, blue, and green regions of the spectrum are utilized. These LEDs are arranged along the edge of the light pipe to approximate a linear source when viewed at a distance. To minimize the size of the color mixing region in the light source, the LEDs for each triplet should be as close together as possible. Light sources based on packaged LEDs are limited by the packaging in which the die is mounted. In general, the actual LED dies are relatively small, typically 0.5 mm across. Hence, the individual LEDs are grouped into triplets that are packaged as close together as possible to form an approximation to a white LED. The "white" LEDs, in turn, are distributed along the edge of the light pipe with a spacing that is as close as possible while providing the desired average light intensity.

Figure 5:
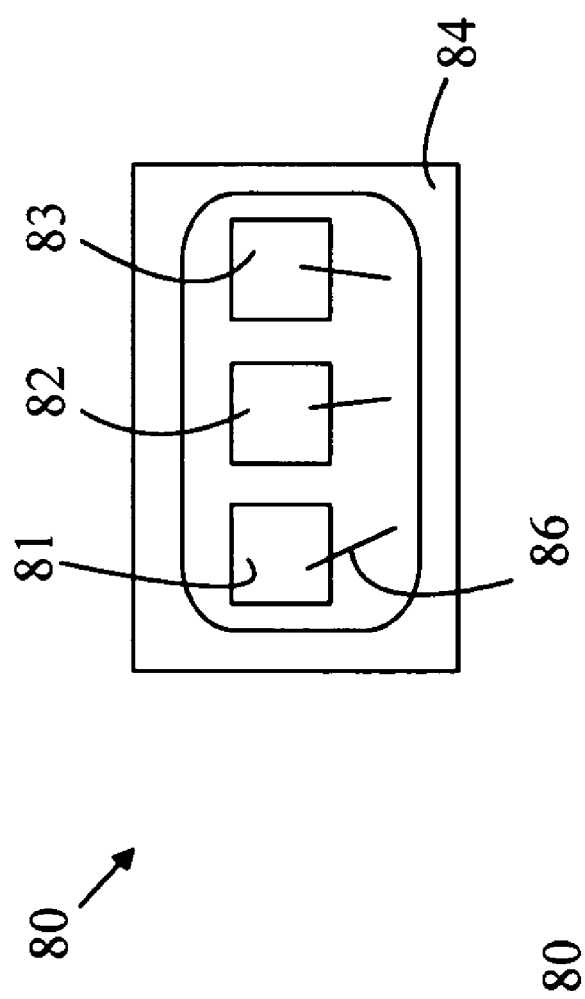
FIG. 5 is a top view of module 80.
Figure 6:
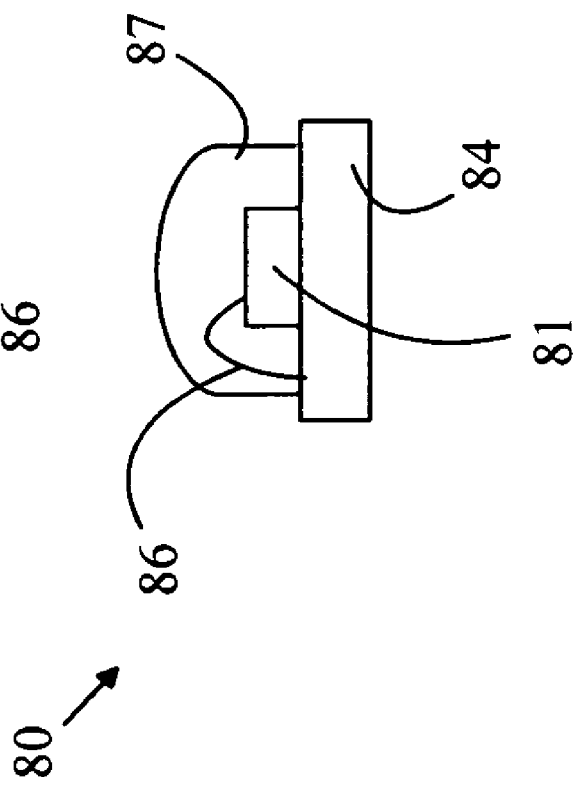
FIG. 6 is a side view of module 80.

Refer now to FIGS. 5-6, which illustrate a white light module 80 based on three chips that emit light in the red, blue, and green regions of the spectrum, respectively. FIG. 5 is a top view of module 80, and FIG. 6 is a side view of module 80. Module 80 is constructed from LED dies 81-83 that are mounted on a substrate 84 that includes the electrical traces for providing signals to the dies. The dies utilized for LED 80 have a bottom contact that is common to all of the dies and top contacts that are used to power the individual dies with signals that determine the intensity of light that is emitted by the die. The top terminals are connected to pads on substrate 84 by wire bonds 86. The dies are encapsulated in a clear plastic 87. Since the preferred configuration approximates a linear source, the LEDs are mounted on the same line rather than in an arrangement in which the LEDs are mounted at the vertices of a triangle. While this positioning results in the LEDs being somewhat further apart, it assures that the LEDs emit light into the same cone of angles with respect to the light pipe.

The LED module is preferably thinner than the light pipe so that the light from the LEDs can be coupled directly into the light pipe without any intermediate light piping arrangement. The light pipes utilized in many handheld devices are less than or equal to 0.8 mm. The dies are less than 0.5 mm; hence, the present invention can provide the desired coupling to the light pipe. The individual dies can be placed as close as 0.5 mm, and hence, provide a module having a set of red, blue, and green dies that provides a good approximation to a point source of an arbitrary color.

There is a tradeoff between the number of such modules along the edge of the light pipe and the cost of the light source. The best performance is obtained by packing the modules as close as possible along the length of the edge of the light pipe. This arrangement provides the best approximation to a linear light pipe and requires the smallest mixing region. However, this arrangement has the highest cost, as the total number of dies is large. If the number of modules is reduced to reduce the cost, there will be spaces between the modules, and the resulting light source will be a poor approximation to the desired linear light source. To compensate for the poorer approximation, a larger mixing region is required.

If the thickness of the light pipe is much greater than the width of an LED die, then the advantages of placing all of the dies on the same line are reduced. In this case, the dies can be placed in a number of closely spaced lines in the form of a two-dimensional array of dies in which the length of the array is much greater than the width. Such an arrangement can provide a higher light intensity, and hence, is better suited to light pipes that have higher surface areas.

It should also be noted that the individual LEDs can be incorporated in a single long package that spans the length of the light pipe edge. In this case, the single encapsulated array of LEDs is attached to the flexible carrier rather than the individual modules discussed above Refer now to FIGS. 7 and 8, which are more detailed views of a light source on a flexible circuit carrier for use in an illumination system according to the present invention. FIG. 7 is a top view of light source 90, and FIG. 8 is a side view of light source 90. Light source 90 includes a plurality of LED modules shown at 91 that are bonded to the front side of flexible circuit carrier 93. Flexible circuit carrier 93 includes conductive traces on the front and backsides of a flexible insulating layer 99. In this embodiment, the LED modules include contacts on the bottom side of substrate 95. The signal contacts are connected to conductive traces 92 on the front side of flexible circuit carrier 93. A heat-conducting layer 96 on the bottom surface is connected to substrate 95 by a metal filled via 97. Heat-conducting layer 96 can also act as a common power rail for the LED modules in arrangements in which the LEDs are driven in parallel. The conductive traces 92 on the front side of the flexible circuit carrier are connected to a multi-conductor connector 93 on the backside of the flexible circuit carrier through vias 101. Connector 93 also includes areas connected to layer 96 for conducting heat to a circuit board to which connector 98 is soldered or mechanically connected. It should also be noted that only the region of flexible circuit carrier 93 that is shown at 102 needs to be flexible.

The flexible circuit carrier utilized in the present invention significantly simplifies the mounting of the light source and LCD panel on a rigid printed circuit board. Refer now to FIG. 9, which is a cross-sectional view of a display 150 according to one embodiment of the present invention. Display 150 includes an LCD panel 110 that is illuminated with light from a light pipe 115 as described above. The light in light pipe 115 is generated by a plurality of LED modules 114 that are affixed to one end of light pipe 115 by a transparent material such as an epoxy. The light source comprising LED modules 114 and light pipe 115 is affixed to the LCD panel 110 and circuit board 111 by two clamps shown at 120 and 121. A spring mechanism is used to hold this assembly against printed circuit board 111. For example, one or more resilient pads such as pads 112 and 113 can be used to provide the spring loading of the clamps. The connections between the LED modules and the printed circuit board are provided by flexible circuit carrier 131 in a manner analogous to that described above. It should be noted that the reflector 122 can be included as part of clamp 120 in this arrangement.

Flexible circuit carriers that are suitable for use in the present invention are available commercially, and hence, will not be discussed in detail here. For example, Multi-Fineline Electronix, Inc. of Anaheim, Calif. manufactures carriers that are suitable for use in the present invention. For the purposes of the present discussion, it should be noted that such carriers are available in thickness that are less than 0.2 mm, and hence, provide more effective heat dissipation than conventional ridged printed circuit boards, since the heat can be moved through the carrier to the side opposite that on which the components are placed.

Various modifications to the present invention will become apparent to those skilled in the art from the foregoing description and accompanying drawings. Accordingly, the present invention is to be limited solely by the scope of the following claims.

What is claimed is:

1. A light source comprising:
  a flexible circuit carrier comprising a sheet of flexible material having electrically conducting traces connecting a circuit mounting area and a connector region, said sheet of flexible material further comprising a first side on which said circuit mounting area and said conducting traces are positioned and a second side;

a plurality of light emitting modules positioned on said first side of said sheet of flexible material, said light emitting modules being electrically connected to said circuit mounting area;

a heat-conducting layer positioned on said second side of said sheet of flexible material; and at least one heat-conducting member passing through said sheet of flexible material from said first side to said second side, said heat-conducting member being positioned between said heat-conducting layer and at least one of said light emitting modules in order to transfer heat from said at least one of said light emitting modules to said heat-conducting layer.

2. The light source of claim 1 wherein said heat-conducting layer comprises a metallic layer positioned on said second side of said sheet of flexible material.

3. The light source of claim 1 wherein said flexible sheet is tapered such that said connector region has a width less than said circuit mounting region.

4. The light source of claim 1 wherein said light emitting modules are arranged in a linear array.

5. The light source of claim 1 wherein one of said light emitting modules comprises a plurality of LED dies bonded to a substrate separate from said flexible circuit carrier, said LED dies being collectively encapsulated in a single layer of clear encapsulant.

6. The light source of claim 1 further comprising a light pipe comprising a planar layer of transparent material characterized by a light pipe thickness and top and bottom surfaces, said plurality of light emitting modules being bonded no an edge of said planar layer such that light from said light emitting modules enters said edge and is reflected between said top and bottom surfaces, said bottom surface comprising light scattering centers for scattering light in said planar layer at angles that allow said light to exit said top surface.

7. The light source of claim 6 further comprising a printed circuit board, said light pipe being attached to said printed circuit board.

8. The light source of claim 7 wherein said connector region of said flexible circuit carrier is connected to said printed circuit board.

9. The light source of claim 7 wherein said printed circuit board is attached to said light pipe by a mechanical clamp.

10. The light source of claim 7 further comprising a reflective layer below said bottom surface.

11. A light source comprising:

a flexible circuit carrier comprising a sheet of flexible material having electrically conducting traces connecting a circuit mounting area and a connector region;

a plurality of light emitting modules electrically connected to said circuit mounting area; and a light pipe comprising a planar layer of transparent material characterized by a light pipe thickness and top and bottom surfaces, said plurality of light emitting modules being bonded to an edge of said planar layer such that light from said light emitting modules enters said edge and is reflected between said top and bottom surfaces, said bottom surface comprising light scattering centers for scattering light in said planar layer at angles that allow said light to exit said top surface;

wherein said planar layer is divided into an illumination region and a light mixing region and wherein said light source further comprises a reflector for directing light leaving said top surface in said mixing region back through said top surface of said mixing region.

12. The light source of claim 11 further comprising an LCD panel that is illuminated by light leaving said top surface, said LCD panel being positioned over said illumination region.

13. A light source comprising:

a flexible circuit carrier comprising a sheet of flexible material having electrically conducting traces connecting a circuit mounting area and a connector region;

a plurality of light emitting modules electrically connected to said circuit mounting area;

a light pipe comprising a planar layer of transparent material characterized by a light pipe thickness and top and bottom surfaces, said plurality of light emitting modules being bonded to an edge of said planar layer such that light from said light emitting modules enters said edge and is reflected between said top and bottom surfaces, said bottom surface comprising light scattering centers for scattering light in said planar layer at angles that allow said light to exit said top surface; and a printed circuit board, said light pipe being attached to said printed circuit board, wherein said printed circuit. board is atbached to said light pipe by a mechanical clamp, and wherein said clamp includes a spring.

14. The light source of claim 13 wherein said spring comprises a resilient pad between said planar layer and said printed circuit board.

* * * * *